United States Patent [19]
Klayman et al.

[11] Patent Number: 5,699,365
[45] Date of Patent: Dec. 16, 1997

[54] APPARATUS AND METHOD FOR ADAPTIVE FORWARD ERROR CORRECTION IN DATA COMMUNICATIONS

[75] Inventors: Jeffrey T. Klayman, Canton; John A. Perreault, Hopkinton; Katherine Unger, Wrentham; Stephen Schroeder, Stoughton, all of Mass.

[73] Assignee: Motorola, Inc., Schaumburg, Ill.

[21] Appl. No.: 625,409

[22] Filed: Mar. 27, 1996

[51] Int. Cl.$^6$ .................................................. H03M 13/00
[52] U.S. Cl. .................................................. 371/5.5; 371/41
[58] Field of Search .................. 371/5.5, 35, 41

[56] References Cited

U.S. PATENT DOCUMENTS

| | | |
|---|---|---|
| 5,546,411 | 8/1996 | Leitch et al. .............. 371/5.5 |
| 5,600,663 | 2/1997 | Ayanoglu et al. ............ 371/41 |

*Primary Examiner*—Stephen M. Baker
*Attorney, Agent, or Firm*—Nancy R. Gamburd; Jeffrey T. Klayman

[57] ABSTRACT

An apparatus (101, 110) and method for adaptive forward error correction in a data communication system (100) provides for dynamically changing forward error correction parameters based upon communication channel conditions, such as noise levels or error rates. In the method embodiment of the invention, data having a current degree of forward error correction is received (305), and a channel parameter is monitored (310), such as packet or bit error rates. A threshold level for the channel parameter is determined (315), and the monitored channel parameter is compared to the threshold level (320). When the channel parameter is not within a predetermined or adaptive variance of the threshold level, a revised forward error correction parameter having a greater or lesser degree of forward error correction capability is selected (330, 340, 350, 360), and the revised forward error correction parameter is transmitted (370). The device receiving the revised forward error correction parameter, such as a secondary station (110), then transmits data encoded utilizing the revised error correction parameter (425).

46 Claims, 4 Drawing Sheets

APPARATUS AND METHOD FOR ADAPTIVE FORWARD ERROR CORRECTION IN DATA COMMUNICATIONS

FIELD OF THE INVENTION

This invention relates, in general, to data communications and data communications systems and devices and, more specifically, to an apparatus and method for adaptive forward error correction in data communications.

BACKGROUND OF THE INVENTION

With the advent of multimedia communications, data transmission has become increasingly complex. For example, multimedia communications applications such as real time transmission of digitally encoded video, voice, and other forms of data, may require new forms and systems for data communication and data transmission. One such new communication system is the CableComm™ System currently being developed by Motorola, Inc. In the CableComm™ System, a hybrid optical fiber and coaxial cable is utilized to provide substantial bandwidth over existing cable lines to secondary stations such as individual, subscriber access units, for example, households having new or pre-existing cable television capability. These coaxial cables are further connected to fiber optical cables to a central location having centralized, primary (or "head end") controllers or stations having receiving and transmitting capability. Such primary equipment may be connected to any variety of networks or other information sources, from the Internet, various on line services, telephone networks, to video/movie subscriber service. With the CableComm™ System, digital data may be transmitted both in the downstream direction, from the primary station or controller (connected to a network) to the secondary station of an individual user (subscriber access unit), and in the upstream direction, from the secondary station to the primary station (and to a network).

In the CableComm™ System, downstream data is currently intended to be transmitted using 64 quadrature amplitude modulation ("QAM") at a rate of 30 M bps (megabits per second), over channels having 6 MHz bandwidth in the frequency spectrum of 50–750 MHz. Anticipating asymmetrical requirements with large amounts of data tending to be transmitted in the downstream direction rather than the upstream direction, less capacity is provided for upstream data transmission, using π/4 differential quadrature phase shift keying (π/4-DQPSK) modulation in the frequency band from 5–42 MHz with a symbol rate of 384 k symbols/sec with 2 bits/symbol. In addition, the communication system is designed to have a multipoint configuration, i.e., many end user secondary stations (also referred to as subscriber access units) transmitting upsteam to a primary station, with one or more primary stations transmitting downstream to the secondary stations. The communication system is also designed for asynchronous transmission, with users transmitting and receiving packets of encoded data, such as video or text files. In addition, it is also highly likely that transmission may be bursty, with various users receiving or transmitting data at indeterminate intervals over selected channels in response to polling, contention, or other protocols from the primary station, rather than transmitting a more continuous and synchronous stream of information over a dedicated or circuit switched connection.

For such asynchronous data transmission, it is highly desirable to organize data into recognizable formats or packets for reliable detection by the receivers of the primary station or the secondary station. In the CableComm™ System, the initial portion (or preamble) of the data packet contains timing or synchronization information for accurate data transmission. Following the timing information is encoded data, which may be encoded for both security (encryption) and for error correction. Following the encoded data are error correction information (as encoded bits) and also additional error detection information in the form of cyclic redundancy check (CRC) bits. One difficulty with inclusion of such error correction information is that such inclusion increases the overall packet size, adding overhead for data transmission and correspondingly decreasing data throughput. Secondly, the inclusion of such error correction information typically increases the system response time or latency, due to the time which may be consumed in the error correction encoding and decoding processes. In addition, there may be situations, such as low noise conditions, in which inclusion of such error correction information may be unnecessary, and higher data throughput may be achieved without the additional overhead of error correction information. Various prior art methods for providing error correction capability, however, typically provided only for a fixed error correction capability, without regard for other opportunities to increase data throughput, for low noise conditions, or for needs to decrease response latency. Accordingly, a need has remained for an apparatus and method to provide for adaptive and flexible error correction capability, providing sufficient error correction for accurate data reception while simultaneously providing for overhead minimization for increased data throughput, and for such an apparatus and method to respond and adapt to potentially changing and variable communication channel conditions.

DETAILED DESCRIPTION OF THE INVENTION

As mentioned above, a need has remained for an apparatus and method to provide for adaptive and flexible error correction capability. The apparatus and method in accordance with the present invention provides such adaptive and flexible error correction capability, providing sufficient error correction for accurate data reception, and also providing for overhead minimization for increased data throughput. The apparatus and method of the present invention is also able to respond and adapt to potentially changing and variable communications channel conditions, such as changes in noise conditions and error rates.

Figure 1:
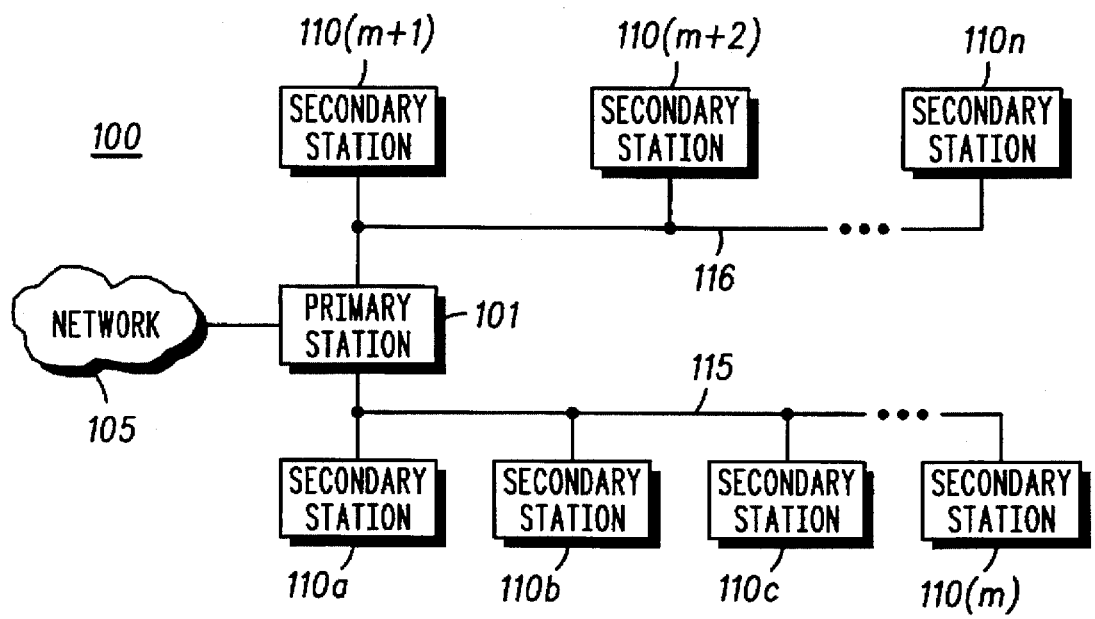
FIG. 1 is a block diagram illustrating a communication system in accordance with the present invention.

FIG. 1 is a block diagram illustrating a communication system 100 in accordance with the present invention. As illustrated in FIG. 1, a primary station 101, also referred to as a primary transceiver or a primary device, is coupled to a plurality of secondary stations $110_a$ through $110_n$, via communications (or communication) media 115 and 116. In the preferred embodiment, communications media 115 and 116 are hybrid optical fiber and coaxial cable. In other embodiments, the communications media, such as communications media 115 and 116, may be coaxial cable, fiber optic cable, twisted pair wires, and so on, and may also include air, atmosphere or space for wireless and satellite communication. The primary station 101 is also coupled to a network 105, which may include networks such as the Internet, on line services, telephone and cable networks, and other communication systems. The secondary stations $110_a$ through $110_n$ are illustrated in FIG. 1 as connected to the primary station 101 on two segments or branches of a communications medium, such as communications media 115 and 116. Equivalently, the secondary stations $110_a$ through $110_n$ may be connected to more than one primary station, and may be connected to a primary station (such as primary station 101) utilizing more or fewer branches, segments or sections of any communications medium.

Continuing to refer to FIG. 1, in the preferred embodiment, the communications medium, such as communications media 115 and 116, has or supports a plurality of communications channels. For ease of reference, the communications channels in which a primary station, such as the primary station 101, transmits information, signals, or other data to a secondary station, such as secondary station $110_n$, are referred to as downstream channels or downstream communication channels. Also for ease of reference, the communications channels in which a secondary station, such as secondary station $110_n$, transmits information, signals, or other data to a primary station, such as primary station 101, are referred to as upstream channels or upstream communication channels. These various upstream and downstream channels may, of course, be the same physical channel or may be separate physical channels, for example, through time division multiplexing or frequency division multiplexing. These various channels may also be logically divided in other ways, in addition to upstream and downstream directions. As mentioned above, in the preferred embodiment of the CableComm™ System, the communications medium is a hybrid fiber coaxial cable, with downstream channels in the frequency spectrum (or band) of 50–750 MHz, and with upstream channels in the frequency spectrum of 5–42 MHz.

Figure 2:
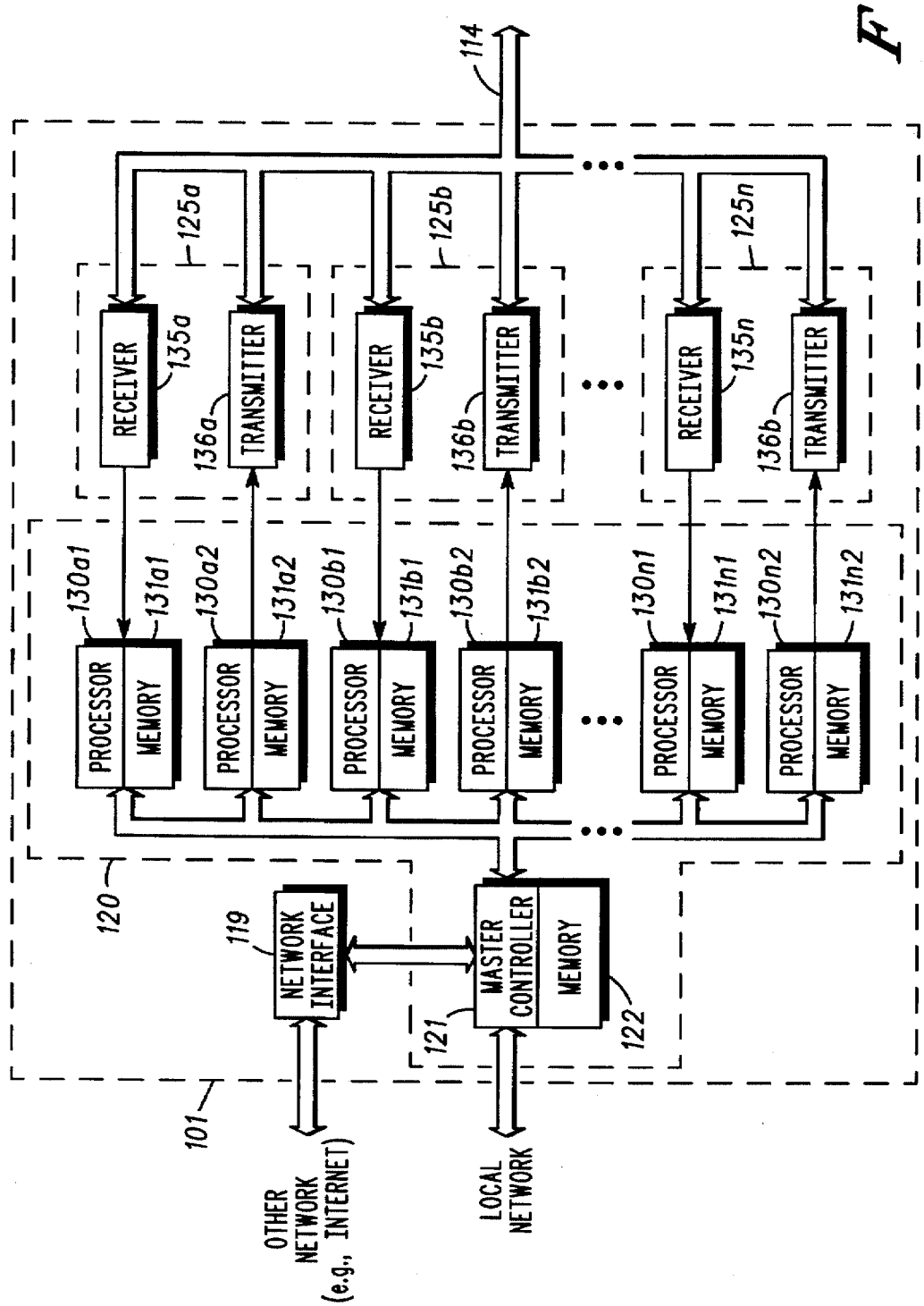
FIG. 2 is a block diagram illustrating a primary station apparatus in accordance with the present invention.

FIG. 2 is a block diagram illustrating a primary station 101 in accordance with the present invention. The primary station 101 is coupled to a communication medium 114 for upstream and downstream communication to one or more secondary stations (not illustrated), and is coupleable to a network, such as the Internet, through a network interface 119. The primary station includes a processor arrangement 120 which is connected to a plurality of channel interfaces, channel interface $125_a$ through channel interface $125_n$, for communication over the communication medium 114. The processor arrangement 120 includes a master controller 121 having or connected to memory 122, and one or more additional processors $130_{a1}$ through $130_{n2}$ and corresponding associated memories $131_{a1}$ through $131_{n2}$. In the preferred embodiment, the master controller 121 is a Motorola M68040 processor, and the memory 122 is 16 MB RAM. The master controller 121 performs a variety of higher level functions in the preferred embodiment, such as spectrum management, routing functions, management of secondary stations, and communication protocol management (such as SNMP management). The master controller 121 is connected to a plurality of other processors, collectively referred to as processors 130 and separately illustrated as processor $130_{a1}$, processor $130_{a2}$, through processor $130_{n1}$ and processor $130_{n2}$. Each of these processors, processor $130_{a1}$, processor $130_{a2}$, through processor $130_{n1}$ and processor $130_{n2}$, is also coupled to or contains corresponding memory circuits, memory $131_{a1}$, memory $131_{a2}$, through memory $131_{n1}$ and memory $131_{n2}$. In the preferred embodiment, each of these processors 130 are also Motorola M68040 processors, while the corresponding memory circuits, memory $131_{a1}$ through memory $131_{n2}$, are 4 MB RAM. In the preferred embodiment, the processors 130 perform such functions related to upstream and downstream data protocols, such as sending a poll message or an acknowledgment message downstream. Each of these processors $130_{a1}$ through $130_{n2}$ of the processor arrangement 120 are connected to corresponding receivers and transmitters of the channel interfaces, channel interface $125_a$ through channel interface $125_n$ (collectively referred to as channel interfaces 125), namely, receiver $135_a$ through receiver $135_n$ (collectively referred to as receivers 135) and transmitter $136_a$ through transmitter $136_n$ (collectively referred to as transmitters 136). In the preferred embodiment, depending upon the functions implemented, each of the receivers $135_a$ through $135_n$ may include a Motorola M68302 processor, a Motorola 56000 series digital signal processor, a ZIF SYN integrated circuit, and an LSI Logic L64714 (Reed-Solomon decoder), for demodulation and for decoding forward error correction and cyclic redundancy checks. In the preferred embodiment, also depending upon the functions implemented, each of the transmitters $136_a$ through $136_n$ may include a Motorola M68302 processor, a Motorola 56000 series digital signal processor, a ZIF SYN integrated circuit, and an LSI Logic L64711 (Reed-Solomon encoder), for modulation and for coding for forward error correction and cyclic redundancy checks. As a consequence, as used herein, the channel interfaces 125 may be considered to perform the functions of data and other signal reception and transmission, regardless of the specific hardware implementations and additional functions which may or may not be implemented. The various memories illustrated, such as memory 122 or $131_{a1}$, may also be embodied or contained within their corresponding processors, such as master controller 121 or processor $130_{a1}$. The functions of these various components with respect to the present invention are explained in greater detail below with reference to FIGS. 4 and 5.

Figure 3:
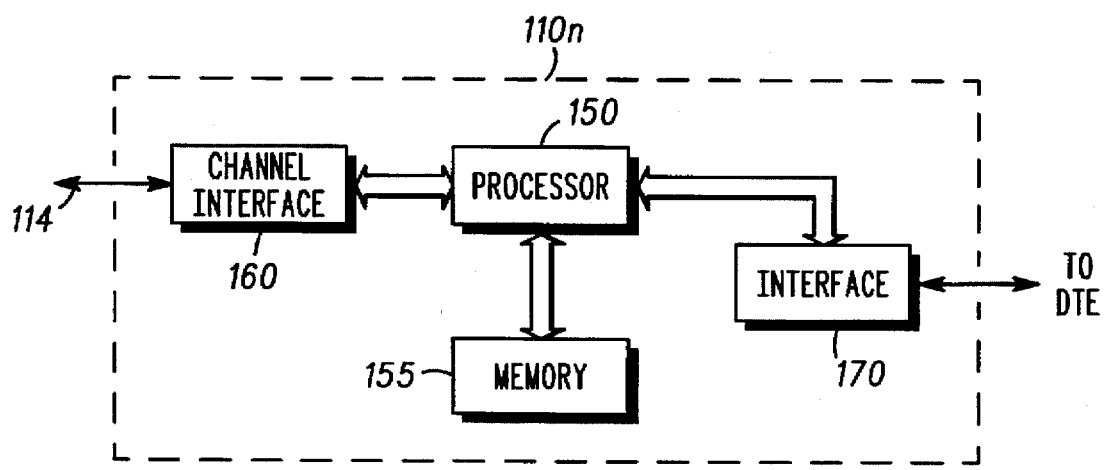
FIG. 3 is a block diagram illustrating a secondary station apparatus in accordance with the present invention.

FIG. 3 is a block diagram illustrating a representative secondary station $110_n$ (of the plurality of secondary stations 110) in accordance with the present invention. The secondary station $110_n$ includes a processor (or processor arrangement) 150, with the processor 150 having or coupled to a memory 155. In the preferred embodiment, the processor 150 is a Motorola M68302 processor (also known as an integrated multiprotocol processor), and the memory 155 is 256K RAM. The processor 150 is coupled to an interface 170, such as an ethernet port or an RS232 interface, for connection to a computer, a workstation, or other data terminal equipment ("DTE"). The processor 150 is also coupled to a channel interface 160 for communication over the communication medium 114. The channel interface 160, in the preferred embodiment, depending upon the functions implemented, includes a Motorola M68HC11 integrated circuit, a ZIF SYN integrated circuit, a Broadcom BCM3100 QAMLink integrated circuit, a Motorola TxMod integrated circuit, and LSI Logic L64711 and L64714 integrated circuits, and performs such functions as forward error correction encoding and decoding, QAM demodulation (for downstream reception), QPSK modulation (for upstream transmission), transmit level and frequency adjustment, for data and other signal reception and transmission. As a consequence, as used herein, the channel interface 160 may be considered to perform the functions of data and other signal reception and transmission, regardless of the specific hardware implementations and additional functions which may or may not be implemented. The memory illustrated as memory 155 may also be embodied or contained within the corresponding processor 150. The additional functions of these components of a secondary station 110$_n$ with respect to the invention are also described in greater detail below with reference to FIGS. 4 and 5.

As mentioned above, the upstream channels of the communication medium, in the preferred CableComm™ System, are in a frequency range between 5 and 42 MHz and may be susceptible to interference from typical noise sources. Forward error correction is preferably employed on the upstream channels as a way of compensating for data transmission errors which may have been caused by noise or other distortions. Forward error correction comprises an error correcting code that is added to the user data to allow a receiver to correct certain types and sizes of errors that may have occurred during the transmission of the data. The transmitting unit, such as the processor 150 and channel interface 160 of a secondary station 110$_n$, generates the error correcting code from the user data, and appends the encoded data onto the user data during transmission. The receiving unit, such as receiver 135$_n$ and processor 130$_{n2}$ of the primary station 101, uses the encoded data to detect received errors and to correct detected errors. As a consequence, the receiving unit should know, prior to the receipt of actual data, what type of error correcting code is to be employed by the transmitting unit, for proper decoding and error correction. This may be typically done by prior agreement (e.g., during initial set up or configuration of the communication system), or during a negotiation "handshake" during establishment of the communications link.

In addition, there are many types of error correcting codes, which are generally categorized as either convolutional codes, which correct random bit errors, and block codes, which correct burst errors. Two or more error correcting codes may be used together to obtain a total error correcting capability or power that is greater than the sum of the capabilities of the individual codes, and are typically referred to as "concatenated" codes. A popular concatenated code uses a convolutional "inner" code and a block "outer" code. The performance of a block error correcting code, moreover, may often be increased using an "interleaving" technique, in which data which may be subject to a burst error is spread out over multiple blocks, thereby providing each block code a higher probability of correcting a small portion of the large burst error. The correcting power of an interleaving technique is determined or measured as a function of interleaver depth. Trellis coding techniques may also be utilized.

The preferred embodiment utilizes a Reed-Solomon error correcting code for forward error correction on the upstream channels, without additional convolutional coding and interleaving. The Reed-Solomon error correcting code is known and is a block code, such that the error correcting code is computed over a block of data having a fixed size. A Reed-Solomon code is typically specified by a parameter pair (n, k), in which "n" is the code word size and "k" is the block size, such that an n-byte code word consists of k data bytes and (n–k) redundancy bytes (which represent the error correcting code information). The maximum number of symbol errors that can be corrected by a Reed-Solomon code is t=(n–k)/2, where a symbol is typically one 8-bit byte. A commonly used Reed-Solomon code is a (128, 122) code, where the code word size is 128 bytes, each code word consists of 122 data bytes and 6 redundancy bytes, enabling a decoder to correct up to three byte errors in each 128 byte code word. In addition to a Reed-Solomon code, other error correcting codes and encryption algorithms may also be used.

In a typical prior art forward error correction implementation, the forward error correction parameters are set to a predetermined and fixed value to compensate for a particular level of noise on the communications channel. If the noise level on the communications channel becomes excessive, such that the noise exceeds the ability of the forward error correction to correct transmission errors, the data will be received in error. In that case, the data must be retransmitted or, in a worst case situation, the communications channel may no longer be usable. In either situation, data throughput is significantly decreased (or eliminated).

Forward error correction parameters, however, illustrate a balance between the amount of overhead added by the error correcting code itself (which utilizes space which could have been used for data and therefore decreases data throughput), on the one hand, and the amount of error correction needed due to channel conditions (which may serve to increase data throughput through avoidance of retransmission), on the other hand. In the preferred embodiment, to maximize throughput of user data over a given communications channel, the optimal error correcting methodology would utilize precisely enough error correction to compensate for the existing noise level, and no more or less. Any more error correcting capability lowers throughput due to excessive overhead from transmitting the error correcting code information, while any less lowers the throughput due to the overhead caused by retransmission of data received in error. The level of noise on a communications channel, however, may vary over time, rendering a selection of a fixed set of forward error correction parameters less than optimal at any given time. One prior art method, as mentioned above, selects a fixed set of forward error correction parameters to compensate for a typical or anticipated noise level, but ceases to use the communication channel when the noise becomes excessive. This prior art method of utilizing fixed error correction code parameters is unsuitable for situations in which the number of available channels is limited, in which case it would be preferable to maintain a channel at a reduced throughput level rather than eliminate use of the channel altogether.

Secondly, another objective of the communication system of the preferred embodiment concerns minimizing the amount of throughput delay introduced by the communications equipment. Throughput delay in a polled protocol, for example, may be defined as the amount of time between the sending of a poll message prior to forward error correction encoding and the receipt of a response to the poll message following forward error correction decoding. Forward error correcting codes typically introduce such throughput delay due to the processing and computational requirements of error correction encoding and decoding, and the amount of throughput delay is typically proportional to the error correcting power of the code. For example, the delay introduced by the interleaving/de-interleaving process is proportional to the interleaver depth, and the delay introduced by the Reed-Solomon encoding/decoding process is proportional to the code word size and number of redundancy bytes.

As discussed in greater detail below, the apparatus and method of the present invention provides a means for signaling and changing the forward error correction parameters (typically used on an upstream channel), based upon variable channel quality, such as variable noise or error levels. As a consequence, the preferred embodiment of the present invention provides a mechanism to optimize data throughput for varying noise levels (and corresponding error rates), while simultaneously providing a mechanism to decrease throughput delay as needed or as desired.

Figure 4:
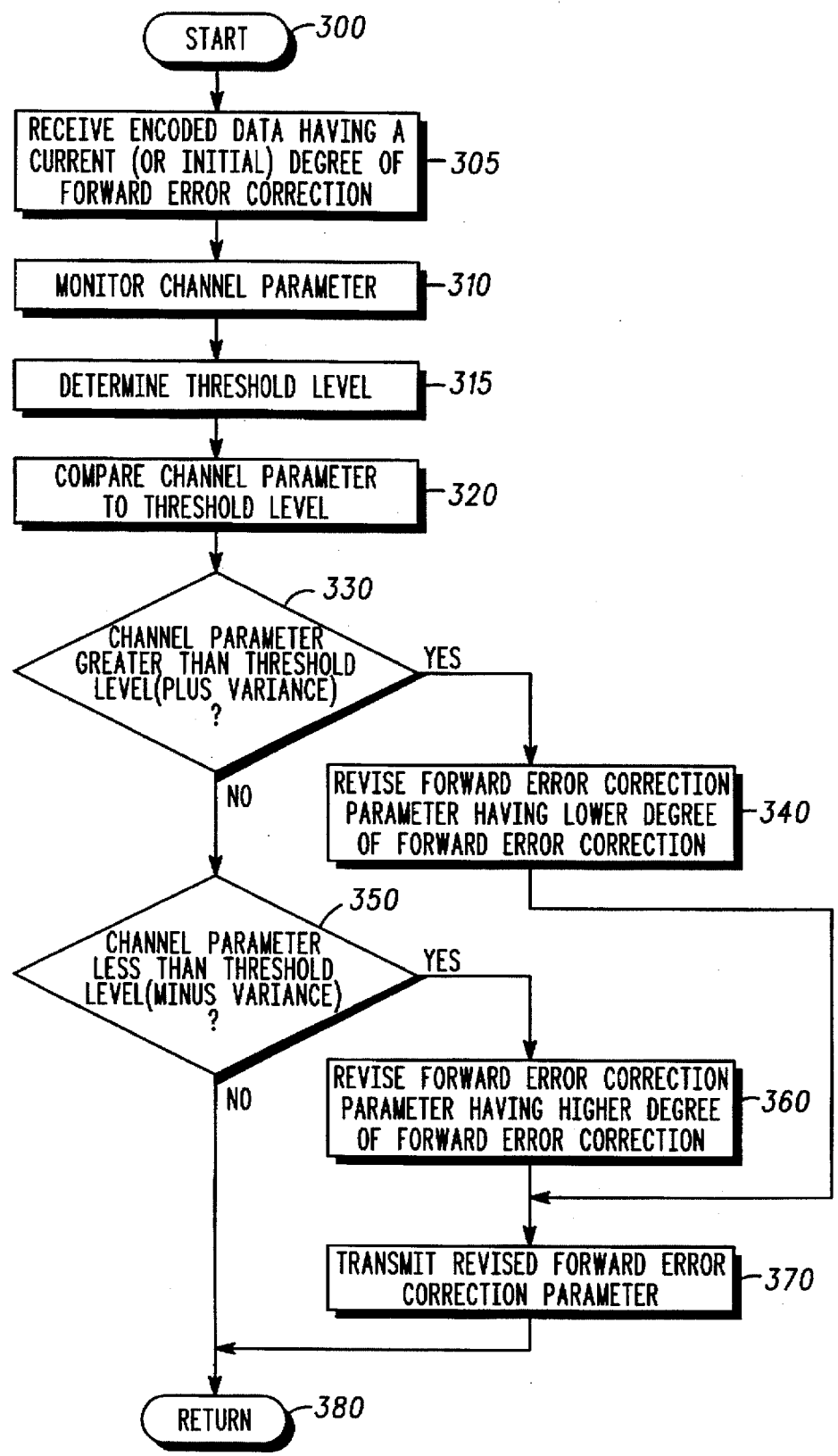
FIG. 4 is a flow chart illustrating channel monitoring and forward error correction parameter adjustment in accordance with the present invention.

FIG. 4 is a flow chart illustrating channel monitoring and forward error correction parameter adjustment in accordance with the present invention. Beginning with start step 300, the method proceeds to receive encoded data having a first or initial degree of forward error correction, from a plurality of degrees of forward error correction, in step 305. The plurality of degrees of forward error correction result from the variable levels of correcting capability associated with various codes and with various parameters of such codes. For example, different error correcting capabilities result from the specification of different error correcting parameters such as (n, k) parameters, e.g., (128, 122), (200, 196), or (128, 124), from inclusion of different types of error correcting codes, such as concatenation of codes or inclusion of interleaving (with a specified depth), and by specification of any parameters associated with such codes. In the preferred embodiment, the initial degree of forward error correction may be established during an initial registration process, when a secondary station establishes a communication link with a primary station. Typically in the preferred embodiment, the primary station polls individual secondary stations, where each poll message contains a secondary station identifier, an upstream channel number, and the parameters to be used for forward error correction on an upstream response. As explained with reference to FIG. 5, when the secondary station receives the poll on the downstream channel, it responds on the upstream channel designated in the poll message using the forward error correction parameters also specified in the poll message.

Continuing to refer to FIG. 4, following receipt of encoded data having an initial degree of forward error correction in step 305, channel parameters are monitored in step 310, such as monitoring packet error rates, bit error rates, noise levels (such as levels of impulse noise or ingress noise), other interference, or other parameters or factors which could be correlated with channel quality, error rates, and a desired or necessary degree of error correction capability. For example, monitoring an error rate may comprise monitoring a set of error rate parameters of a plurality of sets of error rate parameters in which the plurality of sets of error rate parameters consist of any of a plurality of combinations of a bit error rate, a packet error rate, a burst error rate, a block error rate, and a frame error rate. Next, a threshold level is determined in step 315, such as a threshold level of packet errors or bit errors. This threshold level may be predetermined, may be set at a default value, or may be adaptive and take on various values depending upon the allowable amount of transmission error. For example, under conditions in which few errors will be allowed, the threshold level may be comparatively low. In circumstances in which throughput latency may be more significant and more errors may be allowable, the threshold level may be comparatively high. Next, in step 320, the channel parameter (monitored in step 310) is compared to the threshold level, step 320, such that if the channel parameter is not within a predetermined or adaptive tolerance or variance of the threshold level (i.e., is not equal to the threshold level plus or minus an allowable tolerance (or variance)), then the degree of forward error correction utilized will be revised, as explained below. The tolerance or variance level may be either predetermined, such as a fixed variance, or adaptive, such as a variance which is changeable over time. If the channel parameter is greater than the threshold level (plus the allowable tolerance, if any) in step 330, indicating that the channel (and its associated noise and distortions) has a comparatively high quality and is causing fewer errors than are capable of being corrected by the current error correcting code, then a revised forward error correcting parameter is selected which has a lower degree of forward error correction capability, i.e., is capable of correcting fewer errors, step 340. In such a case, a lower or lesser degree of forward error correction capability is selected to decrease the overhead associated with utilizing greater error correction capability, when such greater error correction capability is unnecessary because the channel parameter indicates fewer errors needing correction. Conversely, if the channel parameter is less than the threshold level (minus the allowable tolerance, if any) in step 350, indicating that the channel (and its associated noise and distortions) has a comparatively low or poor quality and is causing more errors than are capable of being corrected by the current error correcting code, then a revised forward error correcting parameter is selected which has a higher degree of forward error correction capability, i.e., is capable of correcting more errors, step 360. In this case, a greater or higher degree of forward error correction capability is selected to decrease the overhead associated with retransmission of an entire data packet due to excessive errors, when such greater error correction capability is necessary because the channel parameter indicates more errors needing correction. Eqivalently, depending upon the choice of channel parameter employed, such as noise levels or error rates, the comparative steps 330 and 350 may be reversed or modified. For example, if the selected channel parameter is an error rate, such that if the threshold error rate level with a selected tolerance is exceeded in step 330, then a revised forward error correcting parameter is selected which has a higher degree of forward error correction capability in step 340, with corresponding modifications of steps 350 and 360. Following steps 340 and 360, the revised forward error correction parameter is transmitted, step 370, for example, to a particular secondary station, such as secondary station $110_n$. As this process may be both repeated for each connected (or active) secondary station $110_a$ through $110_n$, and repeated over time (as conditions may vary), it is anticipated that different revised forward error correction parameters will be determined and transmitted to the different secondary stations, and over time, to the same secondary station. The various comparative steps 330 and 350 may also include variance or tolerance levels, such that forward error correction might not be revised unless the channel parameter differs from the threshold level by a predetermined amount or variance, to avoid any interruptions or delay due to comparatively minor variances and correspondingly minor changes in forward error correction capability. In addition, as the error parameters may vary over time, it may be desirable to utilize an average value of error parameters, rather than instantaneous values. The process ends (return step 380) following step 370, or when the channel parameter is equal to the threshold level, i.e., the channel parameter is not greater than the threshold level in step 330 and the channel parameter is not less than the threshold level in step 350, or is otherwise within the allowable tolerance or variance from the threshold level.

In the preferred apparatus embodiment illustrated in FIG. 2, the method illustrated in FIG. 4 may be programmed and stored, as a set of program instructions for subsequent execution, in the primary station 101 and, more particularly, in each of the processors 130 (with their associated memories 131), utilizing packet or bit error data from the forward error correction decoding performed by the corresponding receivers 135. To the extent that adjustable and dynamic forward error correction capability is necessary or desirable in the downstream direction, the method illustrated in FIG. 4 also may be programmed and stored, also as a set of program instructions for subsequent execution, in the processor 150 and memory 155 of a secondary station 110, such as secondary station $110_n$ illustrated in FIG. 3.

In summary, FIGS. 1 and 4 illustrate a method for adaptive forward error correction in a data communication system 100, the data communication system having a communications medium (such as 114, 115 or 116), with the communications medium having a plurality of communications channels. The method then comprises: (a) receiving encoded data over a first communications channel of the plurality of communications channels, the encoded data having a first degree of forward error correction of a plurality of degrees of forward error correction (step 305); (b) monitoring a channel parameter (such as error rate, ingress noise or impulse noise) of the first communications channel to form a monitored parameter (step 310); (c) determining a threshold level of the channel parameter (step 315); (d) comparing the monitored parameter with the threshold level (step 320); (e) when the monitored parameter is not within a variance (either predetermined or adaptive) of the threshold level, changing the first degree of forward error correction to a second degree of forward error correction of the plurality of degrees of forward error correction (steps 330, 340, 350 and 360); and (f) transmitting a forward error correction revision parameter on a second communications channel of the plurality of communications channels, the forward error correction revision parameter corresponding to the second degree of forward error correction (step 370). The various first and second communications channels, of course, may be the same or different logical or physical channels (such as time or frequency division multiplexed channels).

Figure 5:
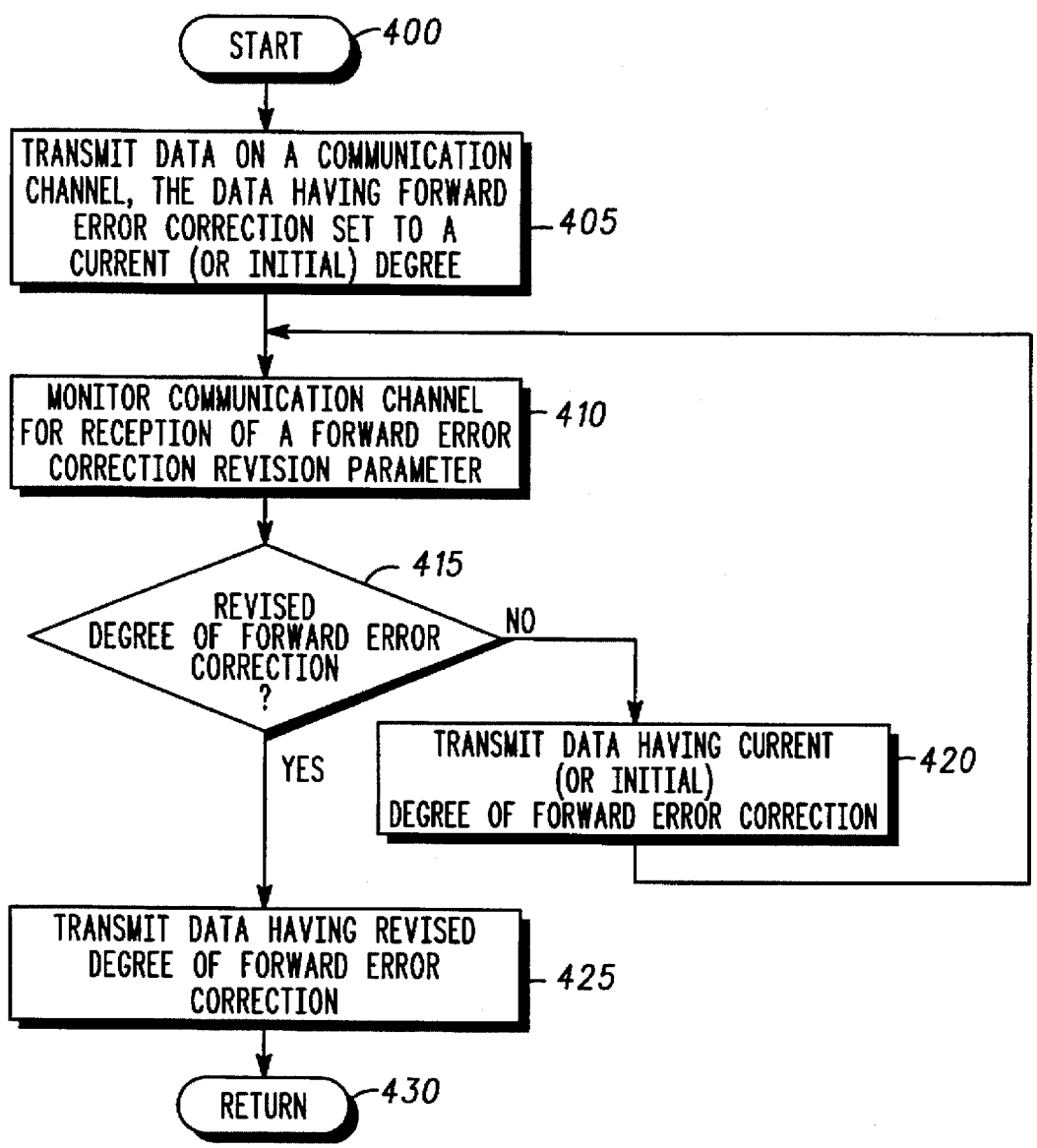
FIG. 5 is a flow chart illustrating forward error correction adjustment and data transmission in accordance with the present invention.

FIG. 5 is a flow chart illustrating forward error correction adjustment and data transmission in accordance with the present invention. In the preferred embodiment, this forward error correction adjustment and data transmission methodology, for upstream data transmission, would also be implemented as a set of program instructions stored in the processor 150 and memory 155 of a secondary station 110. Correspondingly, to the extent that adjustable and dynamic forward error correction capability is necessary or desirable in the downstream direction, the method illustrated in FIG. 5 also may be programmed and stored, also as a set of program instructions for subsequent execution, in a primary station 101, and more particularly, in its processor arrangement 120 (with associated memories), utilizing the forward error correction encoding capability of the associated transmitters 136.

Referring to FIG. 5, beginning with start step 400, data having an initial degree of forward error correction (of a plurality of degrees of forward error correction) is transmitted on a communication channel, step 405. The initial degree of forward error correction may be either predetermined in a secondary station $110_n$, such as currently fixed in its software, or may be signaled or otherwise transmitted from a primary station 101, such as in a poll message as mentioned above. The communication channel is then monitored for reception of a revised forward error correction parameter, step 410, which may, for example, be contained in a specific poll message to a secondary station or may be broadcast in a message to all secondary stations. In addition, while the preferred embodiment utilizes signaling in a link layer through specific poll or broadcast messages, such signaling may be performed at any layer in a communication protocol, including the physical layer, the network layer, or in a software download (from a primary station 101 to a secondary station $110_n$). If a revised degree of forward error correction is not received in step 415, for example, because a received poll continues to indicate the current degree of forward error correction or because a specific poll or other message containing a revised parameter was not received, then the method continues to transmit data at the then current degree (such as the initial degree) of forward error correction, step 420, and continues to monitor the communication channel for a revised parameter, returning to step 410. If a revised degree of forward error correction is received in step 415, then data will be transmitted utilizing the revised degree of forward error correction indicated by the revised forward error correction parameter, step 425, and the process ends, return step 430. As mentioned above with regard to FIG. 4, this process may be repeated for each secondary device and over time (as conditions may vary), and it is also anticipated that different revised forward error correction parameters will be received by the different secondary stations, and over time, by the same secondary station.

In summary, FIG. 5 illustrates a method for adaptive forward error correction in a data communications system 100, the data communications system 100 having a communications medium (114, 115 or 116), with the communications medium having a plurality of communications channels. The method then comprises: (a) transmitting encoded data over a first communications channel of the plurality of communications channels to form transmitted encoded data, the transmitted encoded data having an initial degree of forward error correction of a plurality of degrees of forward error correction (step 405); (b) monitoring a second communications channel of the plurality of communications channels for a forward error correction revision parameter (step 410); (c) determining whether the forward error correction revision parameter indicates a revised degree of forward error correction of the plurality of degrees of forward error correction (step 415); (d) transmitting encoded data having the initial degree of forward error correction when the forward error correction revision parameter does not indicate the revised degree of forward error correction (step 420); and (e) transmitting encoded data having the revised degree of forward error correction when the forward error correction revision parameter indicates the revised degree of forward error correction (step 425). Also, as noted above, the various first and second communications channels may be the same or different logical or physical channels.

Also in summary, FIGS. 2 and 4 illustrate an apparatus 101 for adaptive forward error correction in a data communications system 100, the data communications system 100 having a communications medium (114, 115 or 116), with the communications medium having a plurality of communications channels. The apparatus 101 then comprises, first, a channel interface 125 coupleable to the communications medium 114 for transmission of encoded data on a first communications channel of the plurality of communications channels to form transmitted encoded data and for reception of encoded data on a second communications channel of the plurality of communications channels to form received encoded data, with the received encoded data having a first degree of forward error correction of a plurality of degrees of forward error correction; and second, a processor arrangement 120 coupled to the channel interface 125, the processor arrangement 120 responsive through a set of program instructions to monitor a channel parameter of the second communications channel to form a monitored parameter; the processor arrangement further responsive to compare the monitored parameter with a threshold level of the channel parameter; and when the monitored parameter is not within a variance (or tolerance level) of the threshold level, the processor arrangement is further responsive to change the first degree of forward error correction to a second degree of forward error correction of the plurality of degrees of forward error correction, and to transmit via the channel interface a forward error correction revision parameter on the first communications channel, the forward error correction revision parameter corresponding to the second degree of forward error correction. As illustrated above, the apparatus may be embodied within a primary station 101, which also may be referred to as a primary device or primary transceiver. The channel interface, such as channel interface $125_n$, may also further comprise a receiver and a transmitter, such as receiver $135_n$ and a transmitter $136_n$. The processor arrangement 120 may also further comprise: a first processor coupled to the channel interface 125, such as processor $130_{n1}$; a second processor coupled to the channel interface 125, such as processor $130_{n2}$; and a master controller coupled to the first processor and to the second processor, such as master controller 121.

Also in summary, FIGS. 3 and 5 illustrate an apparatus for adaptive forward error correction in a data communications system 100, the data communications system 100 having a communications medium, with the communications medium having a plurality of communications channels. The apparatus comprises, first, a channel interface 160 coupleable to the communications medium 114 for transmission of encoded data on a first communications channel of the plurality of communications channels to form transmitted encoded data and for reception of encoded data on a second communications channel of the plurality of communications channels to form received encoded data; a processor (or processor arrangement) 150 (including processor 150 with memory 155) coupled to the channel interface 160, the processor arrangement 150 responsive through a set of program instructions to set the transmitted encoded data to a current (or initial) degree of forward error correction of a plurality of degrees of forward error correction, the processor arrangement further responsive to monitor the second communications channel for reception of a forward error correction revision parameter and to determine whether the forward error correction revision parameter indicates a revised degree of forward error correction of the plurality of degrees of forward error correction; the processor arrangement further responsive to transmit encoded data having the current (or initial) degree of forward error correction when the forward error correction revision parameter does not indicate the revised degree of forward error correction and to transmit encoded data having the revised degree of forward error correction when the forward error correction revision parameter indicates the revised degree of forward error correction. As mentioned above, the processor arrangement may be processor arrangement 120, processor 150 or may also be the processor 150 coupled to the memory 155.

The forward error correction parameters carried in the downstream poll in the preferred embodiment may specify the type or types of error correcting codes and the parameters for each error correcting code. The parameters for forward error correction may be specified in a variety of ways, depending upon the chosen embodiment and the types of codes to be utilized. Utilizing a Reed-Solomon code, the (n, k) parameters may be directly specified, for example, using two bytes such as (128, 122). In the preferred embodiment, to decrease the overhead content in poll and other messages, a one byte parameter is utilized as an index to a table (look up table) containing up to 256 variations or combinations of Reed-Solomon (n, k) parameters. The 256 combinations of (n, k) parameters are selected on the basis of which are most likely to be utilized in the selected communications system, such as the CableComm™ System. For example, rather than transmitting two bytes of information specifying (128, 122), in the preferred embodiment, a parameter consisting of one byte of information is transmitted as an index (or pointer) to a look up table stored in memory, which is then translated or converted to the selected (n, k) combination, such as (128, 122). Also in the preferred embodiment, forward error correction may be disabled altogether if a channel has sufficiently low noise, and each type of error correction (e.g., convolutional coding, block coding, concatenation, and interleaving) can be individually enabled or disabled utilizing a specified set of operating parameters.

While carrying the forward error correction information in each downstream poll is the preferred method for the CableComm™ System, an alternative method is to use a special downstream message that is transmitted only when error correcting power is revised. This eliminates the overhead of carrying this information in the downstream polls, which may be frequently sent messages. Moreover, in addition to specifying forward error correction parameters, the primary station could also specify, both initially and as may be subsequently revised, analog parameters to be used for the upstream transmission, such as a modulation mode, carrier frequency, bit rate, baud rate, and bandwidth for each carrier. Improved throughput may be realized by changing the analog parameters, such as modulation mode, instead of the forward error correction, where the amount of overhead that would be added by the forward error correction is greater than the throughput loss caused by a slower but more robust modulation mode. The primary station would then be able to vary the analog parameters, forward error correction, or both, in order to compensate for channel impairments.

Although the preferred embodiment utilizes a poll/response protocol, the invention may also be applied to non-polled protocols, and may use the same or different signaling techniques for dynamically adapting the types of forward error correction and the forward error correction parameters. The invention could also be used where dial-up or other lines are used as the upstream channel. Even though the dial-up line is a dedicated channel, channel characteristics over a public switched network may vary over time and also may vary from connection to connection. Thus, the dynamic adaptive forward error correction could be used to improve throughput over such a dedicated channel.

The ability to dynamically adapt the level of forward error correction for individual channels, in accordance with the present invention, provides several significant advantages. First, it allows continued use of channels that otherwise would have been vacated of all traffic in an implementation which used the prior art fixed level of forward error correction. Even though the throughput rate for that given channel is diminished due to the increased overhead of a more powerful error correcting code, the overall throughput of the communication system is increased through the utilization of an otherwise unacceptable channel. Second, the apparatus and method of the present invention allows the level of error correction to be tailored for each channel, so that a "clean" channel does not carry a greater amount of overhead or introduce a greater amount of throughput delay than that required to compensate for the specific and actual level of noise, rather than a predetermined or anticipated level of noise.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims. The invention is further defined by the following claims.

We claim:

1. A method for adaptive forward error correction in a data communication system, the data communication system having a communications medium, the communications medium having a plurality of communications channels, the method comprising:

(a) receiving encoded data over a first communications channel of the plurality of communications channels, the encoded data having a first degree of forward error correction of a plurality of degrees of forward error correction;

(b) monitoring a channel parameter of the first communications channel to form a monitored parameter;

(c) determining a threshold level of the channel parameter;

(d) comparing the monitored parameter with the threshold level;

(e) when the monitored parameter is not within a variance of the threshold level, selecting a second degree of forward error correction of the plurality of degrees of forward error correction; and (f) transmitting a forward error correction revision parameter on a second communications channel of the plurality of communications channels, the forward error correction revision parameter corresponding to the second degree of forward error correction.

2. The method for adaptive forward error correction in a data communications system of claim 1, further comprising:

(g) repeating steps (a) through (f), inclusive.

3. The method for adaptive forward error correction in a data communications system of claim 1, wherein the channel parameter is an error rate.

4. The method for adaptive forward error correction in a data communications system of claim 1, wherein step (b) further comprises:

monitoring a set of error rate parameters of a plurality of sets of error rate parameters, the plurality of sets of error rate parameters comprising any of a plurality of combinations of a bit error rate, a packet error rate, a burst error rate, a block error rate, and a frame error rate.

5. The method for adaptive forward error correction in a data communications system of claim 1, wherein the channel parameter is ingress noise.

6. The method for adaptive forward error correction in a data communications system of claim 1, wherein the channel parameter is impulse noise.

7. The method for adaptive forward error correction in a data communications system of claim 1, wherein the forward error correction revision parameter is an index to a mapping of Reed-Solomon (n, k) combinations.

8. The method for adaptive forward error correction in a data communications system of claim 1, wherein the forward error correction revision parameter is an encoded Reed-Solomon (n, k) combination.

9. The method for adaptive forward error correction in a data communications system of claim 1, wherein the plurality of degrees of forward error correction are comprised of any of a plurality of combinations of parameters specifying block codes, convolutional codes, concatenated codes, and interleaving depth.

10. The method for adaptive forward error correction in a data communications system of claim 1, further comprising:

(h) transmitting a revised analog parameter on a second communications channel of the plurality of communications channels, the revised analog parameter corresponding to the second degree of forward error correction.

11. The method for adaptive forward error correction in a data communications system of claim 10, wherein the revised analog parameter is comprised of any of a plurality of combinations of parameters specifying a modulation mode, a carrier frequency, a bit rate, a baud rate, and a carrier bandwidth.

12. The method for adaptive forward error correction in a data communications system of claim 1, wherein step (e) further comprises:

(e1) when the monitored parameter is greater than the threshold level plus the variance, selecting the second degree of forward error correction having a lesser error correction capacity than the first degree of error correction; and (e2) when the monitored parameter is less than the threshold level minus the variance, selecting the second degree of forward error correction having a greater error correction capacity than the first degree of error correction.

13. The method for adaptive forward error correction in a data communications system of claim 1, wherein step (e) further comprises:

(e3) when the monitored parameter is less than the threshold level minus the variance, selecting the second degree of forward error correction having a lesser error correction capacity than the first degree of error correction; and (e4) when the monitored parameter is greater than the threshold level plus the variance, selecting the second degree of forward error correction having a greater error correction capacity than the first degree of error correction.

14. The method for adaptive forward error correction in a data communications system of claim 1, wherein the forward error correction revision parameter is transmitted in a link layer protocol message.

15. The method for adaptive forward error correction in a data communications system of claim 1, wherein the forward error correction revision parameter is transmitted in a physical layer protocol signal.

16. The method for adaptive forward error correction in a data communications system of claim 1, wherein the forward error correction revision parameter is transmitted in a network layer protocol signal.

17. A method for adaptive forward error correction in a data communications system, the data communications system having a communications medium, the communications medium having a plurality of communications channels, the method comprising:

(a) transmitting encoded data over a first communications channel of the plurality of communications channels to form transmitted encoded data, the transmitted encoded data having a current degree of forward error correction of a plurality of degrees of forward error correction;

(b) monitoring a second communications channel of the plurality of communications channels for a forward error correction revision parameter;

(c) determining whether the forward error correction revision parameter indicates a revised degree of forward error correction of the plurality of degrees of forward error correction;

(d) transmitting encoded data having the current degree of forward error correction when the forward error correction revision parameter does not indicate the revised degree of forward error correction; and (e) transmitting encoded data having the revised degree of forward error correction when the forward error correction revision parameter indicates the revised degree of forward error correction.

18. The method for adaptive forward error correction in a data communications system of claim 17, further comprising:

(f) repeating steps (a) through (e), inclusive.

19. The method for adaptive forward error correction in a data communications system of claim 17, wherein the forward error correction revision parameter is an index to a mapping of Reed-Solomon (n, k) combinations.

20. The method for adaptive forward error correction in a data communications system of claim 17, wherein the forward error correction revision parameter is an encoded Reed-Solomon (n, k) combination.

21. An apparatus for adaptive forward error correction in a data communications system, the data communications system having a communications medium, the communications medium having a plurality of communications channels, the apparatus comprising:

a channel interface coupleable to the communications medium for transmission of encoded data on a first communications channel of the plurality of communications channels to form transmitted encoded data and for reception of encoded data on a second communications channel of the plurality of communications channels to form received encoded data, the received encoded data having a first degree of forward error correction of a plurality of degrees of forward error correction; and a processor arrangement coupled to the channel interface, the processor arrangement responsive through a set of program instructions to monitor a channel parameter of the second communications channel to form a monitored parameter; the processor arrangement further responsive to compare the monitored parameter with a threshold level of the channel parameter and, when the monitored parameter is not within a variance of the threshold level, the processor arrangement is further responsive to select a second degree of forward error correction of the plurality of degrees of forward error correction and to transmit via the channel interface a forward error correction revision parameter on the first communications channel, the forward error correction revision parameter corresponding to the second degree of forward error correction.

22. The apparatus of claim 21 wherein the apparatus is embodied within a primary station.

23. The apparatus of claim 21 wherein the apparatus is embodied within a secondary station.

24. The apparatus of claim 21, wherein the channel parameter is an error rate.

25. The apparatus of claim 21, wherein the processor arrangement is further responsive to monitor, as the channel parameter, a set of error rate parameters of a plurality of sets of error rate parameters, the plurality of sets of error rate parameters comprising any of a plurality of combinations of a bit error rate, a burst error rate, a block error rate, and a frame error rate.

26. The apparatus of claim 21, wherein the channel parameter is ingress noise.

27. The apparatus of claim 21, wherein the channel parameter is impulse noise.

28. The apparatus of claim 21, wherein the channel interface further comprises a receiver and a transmitter.

29. The apparatus of claim 21, wherein the forward error correction revision parameter is an index to a mapping of Reed-Solomon (n, k) combinations.

30. The apparatus of claim 21, wherein the forward error correction revision parameter is an encoded Reed-Solomon (n, k) combination.

31. The apparatus of claim 21, wherein the plurality of degrees of forward error correction are comprised of any of a plurality of combinations of parameters specifying block codes, convolutional codes, concatenated codes, and interleaving depth.

32. The apparatus of claim 21, wherein the processor arrangement is further responsive to transmit a revised analog parameter on the first communications channel of the plurality of communications channels, the revised analog parameter corresponding to the second degree of forward error correction.

33. The apparatus of claim 32, wherein the revised analog parameter is comprised of any of a plurality of combinations of parameters specifying a modulation mode, a carrier frequency, a bit rate, a baud rate, and a carrier bandwidth.

34. The apparatus of claim 21, wherein when the monitored parameter is greater than the threshold level plus the variance, the processor arrangement is further responsive to select the second degree of forward error correction having a lesser error correction capacity than the first degree of error correction; and when the monitored parameter is less than the threshold level minus the variance, the processor arrangement is further responsive to select the second degree of forward error correction having a greater error correction capacity than the first degree of error correction.

35. The apparatus of claim 21, wherein when the monitored parameter is less than the threshold level minus the variance, the processor arrangement is further responsive to select the second degree of forward error correction having a lesser error correction capacity than the first degree of error correction; and when the monitored parameter is greater than the threshold level plus the variance, the processor arrangement is further responsive to select the second degree of forward error correction having a greater error correction capacity than the first degree of error correction.

36. The apparatus of claim 21, wherein the processor arrangement is further responsive to transmit the forward error correction revision parameter in a link layer protocol message.

37. The apparatus of claim 21, wherein the processor arrangement is further responsive to transmit the forward error correction revision parameter in a physical layer protocol signal.

38. The apparatus of claim 21, wherein the processor arrangement is further responsive to transmit the forward error correction revision parameter in a network layer protocol signal.

39. The apparatus of claim 21, wherein the processor arrangement further comprises:

a first processor coupled to the channel interface;

a second processor coupled to the channel interface; and a master controller coupled to the first processor and to the second processor.

40. An apparatus for adaptive forward error correction in a data communications system, the data communications system having a communications medium, the communications medium having a plurality of communications channels, the apparatus comprising:

a channel interface coupleable to the communications medium for transmission of encoded data on a first communications channel of the plurality of communications channels to form transmitted encoded data and for reception of encoded data on a second communications channel of the plurality of communications channels to form received encoded data; and a processor arrangement coupled to the channel interface, the processor arrangement responsive through a set of program instructions to set the transmitted encoded data to a current degree of forward error correction of a plurality of degrees of forward error correction, the processor arrangement further responsive to monitor the second communications channel for reception of a forward error correction revision parameter and to determine whether the forward error correction revision parameter indicates a revised degree of forward error correction of the plurality of degrees of forward error correction; the processor arrangement further responsive to transmit encoded data having the current degree of forward error correction when the forward error correction revision parameter does not indicate the revised degree of forward error correction and to transmit encoded data having the revised degree of forward error correction when the forward error correction revision parameter indicates the revised degree of forward error correction.

41. The apparatus of claim 40, wherein the forward error correction revision parameter is an index to a mapping of Reed-Solomon (n, k) combinations.

42. The apparatus of claim 40, wherein the forward error correction revision parameter is an encoded Reed-Solomon (n, k) combination.

43. The apparatus of claim 40, wherein the channel interface further comprises a receiver and a transmitter.

44. The apparatus of claim 40, wherein the processor arrangement is an integrated multiprotocol processor coupled to the channel interface.

45. The apparatus of claim 40 wherein the apparatus is embodied within a primary station.

46. The apparatus of claim 40 wherein the apparatus is embodied within a secondary station.

* * * * *